US008394465B2

(12) United States Patent
Lee et al.

(10) Patent No.: US 8,394,465 B2
(45) Date of Patent: Mar. 12, 2013

(54) PREPARATION METHOD OF ELECTROCONDUCTIVE COPPER PATTERNING LAYER BY LASER IRRADIATION

(75) Inventors: Woo-Ram Lee, Daejeon (KR); Sang-Ho Kim, Daejeon (KR); Tae-Su Kim, Daejeon (KR); So-Won Kim, Daejeon (KR)

(73) Assignee: LG Chem, Ltd., Seoul (KR)

( * ) Notice: Subject to any disclaimer, the term of this patent is extended or adjusted under 35 U.S.C. 154(b) by 399 days.

(21) Appl. No.: 12/452,812

(22) PCT Filed: Jul. 24, 2008

(86) PCT No.: PCT/KR2008/004340
§ 371 (c)(1),
(2), (4) Date: Jan. 22, 2010

(87) PCT Pub. No.: WO2009/014391

PCT Pub. Date: Jan. 29, 2009

(65) Prior Publication Data
US 2010/0129566 A1    May 27, 2010

(30) Foreign Application Priority Data

Jul. 26, 2007 (KR) .................. 10-2007-0075340
Mar. 10, 2008 (KR) .................. 10-2008-0022135

(51) Int. Cl.
*B05D 3/00* (2006.01)
*B05D 3/06* (2006.01)
(52) U.S. Cl. .................. 427/555; 427/554; 427/559

(58) Field of Classification Search .................. 427/532, 427/553, 554, 555, 556, 557, 559; 423/604
See application file for complete search history.

(56) References Cited

U.S. PATENT DOCUMENTS

| 2001/0004477 A1 | 6/2001 | Fukunaga et al. |
| 2003/0061965 A1* | 4/2003 | Taguchi .................. 106/31.27 |
| 2006/0098065 A1 | 5/2006 | Maruyama et al. |
| 2006/0166111 A1 | 7/2006 | Umetsu et al. |
| 2007/0096062 A1* | 5/2007 | Kodas et al. .................. 252/500 |

FOREIGN PATENT DOCUMENTS

| JP | 2001-167633 | 6/2001 |
| JP | 2005-281781 | 10/2005 |
| JP | 2006-093003 | 4/2006 |
| JP | 2006-096655 | 4/2006 |
| JP | 2006-201538 | 8/2006 |

(Continued)

*Primary Examiner* — Dah-Wei Yuan
*Assistant Examiner* — Nga Leung V Law
(74) *Attorney, Agent, or Firm* — McKenna Long & Aldridge LLP

(57) ABSTRACT

A preparation method of an electroconductive copper patterning layer includes (Step 1) preparing a dispersion solution of copper-based particles selected from the group consisting of copper particles, copper oxide particles, and their mixtures; (Step 2) forming a copper-based particle patterning layer by printing or filling the dispersion solution of copper-based particles to a substrate into a predetermined shape; and (Step 3) irradiating laser to the copper-based particle patterning layer to burn and interconnect the copper-based particles contained in the copper-based particle patterning layer. This preparation method burns a copper-based particle patterning layer with a strong energy within a short time by using laser. Thus, it is possible to obtain a copper patterning layer that is hardly oxidized even in the atmosphere, so a copper patterning layer with excellent electric conductivity is formed.

5 Claims, 6 Drawing Sheets

| | FOREIGN PATENT DOCUMENTS | | | | |
|---|---|---|---|---|---|
| JP | 2006-212555 | 8/2006 | WO | WO 2004/050559 | 6/2004 |
| KR | 10-2005-0084099 | 8/2005 | WO | WO 2006/093398 | 9/2006 |
| KR | 10-2006-0112025 | 10/2006 | | | |

* cited by examiner ical Field

PREPARATION METHOD OF ELECTROCONDUCTIVE COPPER PATTERNING LAYER BY LASER IRRADIATION

This application claims the benefit of PCT/KR2008/004340 filed on Jul. 24, 2008, Korean Patent Application No. 10-2007-0075340 filed on Jul. 26, 2007 and Korean Patent Application No. 10-2008-0022135 filed on Mar. 10, 2008, all of which are hereby incorporated herein by reference for all purposes in their entirety.

TECHNICAL FIELD

The present invention relates to a preparation method of an electroconductive copper patterning layer such as a copper wiring layer of circuit boards or semiconductor devices or a copper electrode layer of various displays, and more particularly to a preparation method of a copper patterning layer with electric conductivity by using copper-based particles such as copper particles or copper oxide particles.

BACKGROUND ART

Circuit boards, semiconductor devices, and various displays have a patterning layer such as a wiring layer or an electrode layer, which is made of metal such as copper, nickel or silver. In particular, a patterning layer using copper is widely used due to good electric conductivity and low price.

Particularly, copper particles and copper oxide particles such as cuprous oxide may be produced with small diameter in a several nanometer or several micrometer level such that they may form a fine pattern, so they are useful in forming an electroconductive copper patterning layer.

Seeing conventional methods for forming an electroconductive copper patterning layer using copper-based particles, a paste mainly containing copper-based particles is printed on a substrate surface or filled in through holes of the substrate to form a copper-based particle patterning layer, and then the layer is thermally treated at a high temperature under the inert gas circumstance for burning. Accordingly, among the copper-based particles contained in the copper-based particle patterning layer, copper oxides are reduced into copper and thus connected with each other, and organic substances included in the paste are removed, so an electroconductive copper patterning layer is formed (see Japanese Laid-open Patent Publication No. 2006-93003).

This burning method gives a copper patterning layer with good electric conductivity to some extent, but it is not easy to adopt the burning process under an inert gas circumstance in the industrial aspect. On the while, in case a burning process under a common atmospheric circumstance, copper may be oxidized, which results in bad quality of electric conductivity of the formed copper patterning layer.

DISCLOSURE

Technical Problem

Therefore, the present invention is directed to providing a preparation method capable of forming a copper patterning layer with excellent electric conductivity even in the atmosphere by burning a copper-based particle patterning layer within a short time.

Technical Solution

In order to accomplish the above object, the present invention provides a preparation method of an electroconductive copper patterning layer, which includes (Step 1) preparing a dispersion solution of copper-based particles selected from the group consisting of copper particles, copper oxide particles, and their mixtures; (Step 2) forming a copper-based particle patterning layer by printing or filling the dispersion solution of copper-based particles to a substrate into a predetermined shape; and (Step 3) irradiating laser to the copper-based particle patterning layer to burn and interconnect the copper-based particles contained in the copper-based particle patterning layer.

In the preparation method of an electroconductive copper patterning layer according to the present invention, the cuprous oxide particles are preferably cuprous oxide assembly particles, in each of which a plurality of cuprous oxide fine particles with an average diameter of 1 to 100 nm are assembled, and at this time the cuprous oxide assembly particles preferably have an average diameter of 0.1 to 10 μm. Most preferably, the cuprous oxide particle is a spherical cuprous oxide assembly particle in which a plurality of cuprous oxide fine particles with an average diameter of 1 to 100 nm with a standard deviation of 0 to 10% are assembled, and the spherical cuprous oxide assembly particle has an average diameter of 0.1 to 10 μm with a standard deviation of 0 to 40%.

In the preparation method of an electroconductive copper patterning layer according to the present invention, the cuprous oxide particles may have a surface coated with surfactant, which may be at least one material or a mixture of at least two materials selected from the group consisting of polyacrylamide, polyvinylpyrrolidone, polyvinylalcohol, and a monomer having at least one functional group selected from the group consisting of —OH, —COOH, —SH and —NH.

Also, in the preparation method of an electroconductive copper patterning layer according to the present invention, the copper-based particles are preferably selected from the group consisting of copper particles, copper oxide particles, and their mixtures.

In the preparation method of an electroconductive copper patterning layer according to the present invention, the dispersion solution of copper-based particles is preferably a liquid dispersion solution obtained by dispersing copper-based particles into a dispersion solvent or a paste-type dispersion solution obtained by dispersing copper-based particles into a binder resin solution, and the laser may be irradiated in the atmosphere.

DESCRIPTION OF DRAWINGS

FIG. 12 (*b*) is a XRD graph showing a sample obtained by scratching the ② portion of FIG. 8.

BEST MODE

Hereinafter, preferred embodiments of the present invention will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present invention on the basis of the principle that the inventor is allowed to define terms appropriately for the best explanation.

A preparation method of an electroconductive copper patterning layer according to the present invention is as follows.

First, a dispersion solution of copper-based particles such as copper particles, copper oxide particles like cuprous oxide particles, and their mixtures is prepared (Step 1).

The dispersion solution may be a liquid dispersion solution obtained by dispersing copper-based particles into a dispersion solvent such as terpineol, or a paste-type dispersion solution obtained by dispersing copper-based particles into a binder resin solution obtained by dissolving binder resin in a dispersion solvent. The binder resin added to the dispersion solution plays a role of facilitating the patterning. As well known in the art, the dispersion solution may be added with anti-sintering materials such as aluminum oxide or nickel.

Copper particles may be prepared in various known methods such as mechanical grinding, co-precipitation, spraying, sol-gel, and electrolysis. In addition, various methods have been proposed for making copper oxide particles. For example, Japanese Laid-open Patent Publication No. 2006-96655 and Korean Laid-open Patent Publication No. 10-2005-84099 disclose a method for making cuprous oxide fine particles. The copper-based particles of the present invention may adopt any material that can be burned by means of laser irradiation, explained later, to form an electroconductive copper patterning layer. Preferably, copper particles and cuprous oxide particles may be used in single or in mixture.

Figure 1:
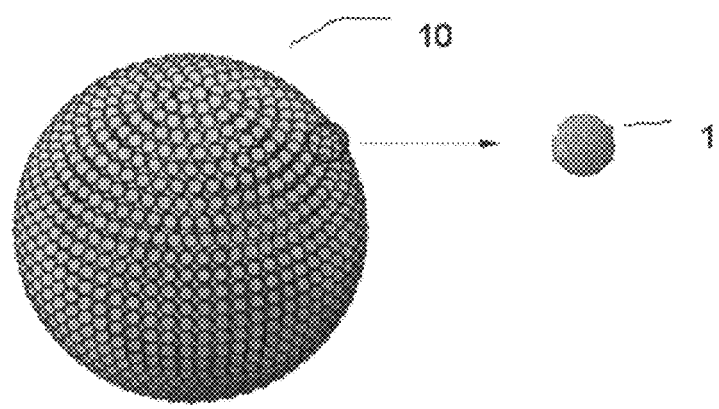
FIG. 1 is a schematic diagram showing an assembly particle of cuprous oxide.

As the cuprous oxide particle, a cuprous oxide assembly particle formed by assembling a plurality of cuprous fine particles with an average diameter of 1 to 100 nm is preferred. If the cuprous oxide assembly particle formed by assembling fine particles is used, a cupper patterning layer can be formed more fast during laser burning due to a lowered melting point. FIG. 1 is a schematic view showing a cuprous oxide assembly particle. Referring to FIG. 1, the cuprous oxide assembly particle 10 is formed by assembling a plurality of cuprous oxide fine particles 1. The cuprous oxide fine particles 1 preferably have an average diameter of 1 to 100 nm. If the average diameter of the cuprous oxide fine particles 1 is less than 1 nm, it is not easy to form the particles. If the average diameter exceeds 100 nm, it is difficult to exhibit properties of the fine particles themselves. The average diameter of the fine particles 1 is more preferably 1 to 10 nm. In addition, a standard deviation for the diameters of the cuprous oxide fine particles 1 is preferably 0 to 10%. If the standard deviation exceeds 10%, it is not easy to form a cuprous oxide assembly particle with uniform size and shape.

Meanwhile, the cuprous oxide assembly particle 10 preferably has an average diameter of 0.1 to 10 μm. If the average diameter of cuprous oxide assembly particles 10 is less than 0.1 μm, it may be useless to form such an assembly particle. If the average diameter exceeds 10 μm, workability may be deteriorated due to the large size of the assembly particles. The average diameter of the cuprous oxide assembly particles 10 is more preferably 0.3 to 2 μm. In addition, a standard deviation for the diameters of the cuprous oxide assembly particles 10 is preferably 0 to 40%, more preferably 0 to 20%, and a spherical shape is preferred. If the standard deviation exceeds 40%, properties may be deteriorated for the patterning during the wiring process due to irregular sizes. In this specification, the spherical shape is defined as including not only a perfect sphere whose aspect ratio is 1 at each section, but also an oval sphere whose aspect ratio is less than 2 at each section.

The cuprous oxide assembly particle, preferably satisfying the above average diameter and the standard deviation, may be prepared in the following way, but not limitedly.

Figure 2:
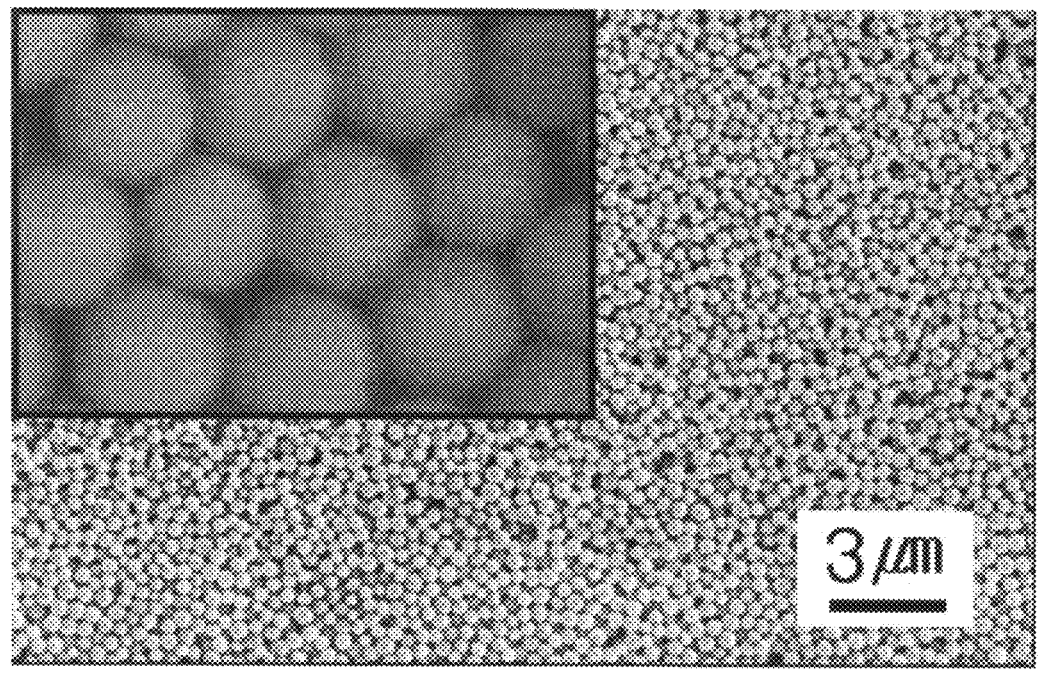
FIG. 2 is a SEM photograph showing a cuprous oxide particle produced according to a composition example.

First, copper carboxyl compound expressed by the following chemical FIG. 1 or carboxyl group-containing compound expressed by the following chemical FIG. 2 are dissolved in a solvent together with copper salt to prepare a copper(II) precursor solution.

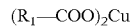

$(R_1-COO)_2Cu$  [Chemical FIG. 1]

where $R_1$ is an alkyl group of $C_1$ to $C_{18}$.

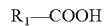

$R_1-COOH$  [Chemical FIG. 2]

where $R_1$ is an alkyl group of $C_1$ to $C_{18}$.

The copper carboxyl compound of the chemical FIG. 1 may be representatively $(CH_3COO)_2Cu$, and the carboxyl group-containing compound of the chemical FIG. 2 may be representative $CH_3COOH$. In addition, the copper salt may be representatively copper nitrate, copper halide, copper hydroxide, and copper sulfate, which may be used in single or in mixture. In addition, the solvent may use any kind of solvent that can allow formation of a cuprous oxide assembly particle when a weak reducing agent is added thereto, as a solvent capable of dissolving the copper carboxyl compound or the carboxyl group-containing compound and the copper salt. For example, the solvent may use water, $C_1$-$C_6$ low alcohol, dimethyl formamide, dimethyl sulfoxide, tetrahydrofuran, acetonitrile, and so on, which may be used in single or in mixture.

Subsequently, a weak reducing agent with a standard reduction potential of $-0.2$ to $-0.05$V is added to the prepared copper(II) precursor solution to assemble a plurality of $Cu_2O$ fine particles having an average diameter of 1 to 100 nm with a standard deviation of 0 to 10%, thereby forming spherical $Cu_2O$ assembly particles having an average diameter of 0.1 to 10 μm with a standard deviation of 0 to 40%. Sizes of assembly particles and cuprous oxide fine particles can be controlled by changing reaction conditions such as kind of solvent and addition of surfactant. The weak reducing agent can be put before copper(II) precursors are dissolved in the solvent, and also the weak reducing agent can be dissolved in a separate solvent and then put into the copper(II) precursor solution. The weak reducing agent preferably has a standard reduction potential of −0.2 to −0.05V, which is advantageous in forming the cuprous oxide assembly particles uniformly. This weak reducing agent may use ascorbic acid, diol compound, citric acid, fructose, amine compound, α-hydroxy ketone compound, succinic acid, maltose and so on, which can be used in single or in mixture.

In order to enhance the uniformity of sizes of cuprous oxide assembly particles, it is possible to further add a surfactant to the copper(II) precursor solution. The size of assembly particles may be controlled depending on the kind and dosage of the surfactant, and the added surfactant is present in a state of being formed on the surfaces of the cuprous oxide assembly particles. The surfactant is an amphipathic material having both a hydrophile group and a hydrophobic group in one molecule, and it may adopt a common surfactant used in preparation of cuprous oxide particles. For example, the surfactant may be a single molecule surfactant having at least one functional group selected from the group consisting of —OH, —COOH, —SH and —NH, or a polymer surfactant such as polyacrylamide, polyvinylpyrrolidone, and polyvinylalcohol, and they may be used in single or in mixture. In particular, in case the surfactant is polyacrylamide, the shapes and sizes of obtained cuprous oxide assembly particles become more uniform, so it is possible to obtain spherical cuprous oxide assembly particles whose standard deviation on the diameter is greatly lowered.

If the step of making cuprous oxide assembly particles is completed, the cuprous oxide assembly particles are separated from the solution by means of centrifugal separation or the like to obtain spherical cuprous oxide assembly particles.

The dispersion solution of copper-based particles, prepared as mentioned above, is printed on or filed in a substrate surface to form a copper-based particle patterning layer (Step 2).

The substrate may be any one that requires an electroconductive copper patterning layer such as copper electrodes and copper wirings, and the copper-based particle patterning layer may be formed using any method capable of forming a desired pattern using the dispersion solution of copper-based particles such as screen printing, dispensing, ink-jetting, and spraying.

After that, laser is irradiated to the copper-based particle patterning layer to burn copper-based particles contained in the copper-based particle patterning layer. Then, the copper particles or copper oxides are changed into copper, and the copper particles are connected with each other, thereby forming an electroconductive copper patterning layer (Step 3). Since the copper-based particle patterning layer is burned using laser with a strong energy within a short time, the copper particles are seldom oxidized even though the process is executed in the atmosphere, and accordingly a copper patterning layer with excellent electric conductivity is obtained. The laser may be irradiated using any kind of laser device known in the art if its output allows the irradiated copper-based particle patterning layer to be changed into an electroconductive copper pattern.

MODE FOR INVENTION

Hereinafter, various preferred examples of the present invention will be described in detail for better understandings. However, the examples of the present invention may be modified in various ways, and they should not be interpreted as limiting the scope of the invention. The examples of the present invention are just for better understandings of the invention to persons having ordinary skill in the art.

Example of composing Cuprous Oxide Assembly Particles 50 mg of $(CH_3COO)_2Cu \cdot H_2O$ and 200 mg of polyacrylamide were dissolved in 4.5 ml of distilled water to prepare a first solution, and 22 mg of ascorbic acid was dissolved in 0.5 ml of distilled water to prepare a second solution. At room temperature and normal pressure and in the air, two solutions were mixed and left fixed for 10 minutes. Subsequently, the mixed solutions were centrifugally separated for 3 minutes at 2000 rpm, and then a supernatant in an upper layer was wasted and the remaining sediment was dispersed again in 20 ml of water. After that, the centrifugal separation was conducted once more to obtain cuprous oxide particles.

Figure 3:
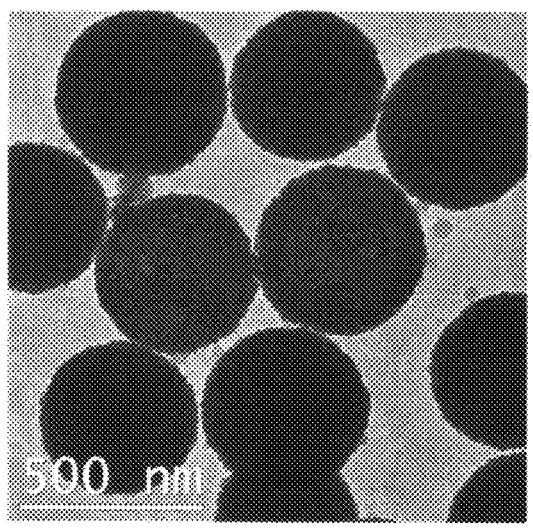
FIG. 3 is a TEM photograph showing the cuprous oxide particle produced according to the composition example.
Figure 5:
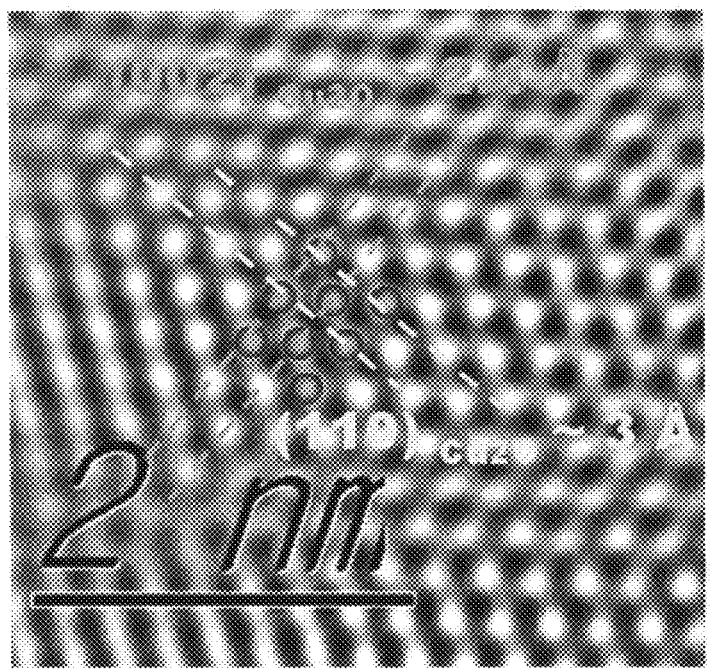
FIG. 5 is a HRTEM photograph for analyzing a structure of the cuprous oxide particle produced according to the composition example.
Figure 6:
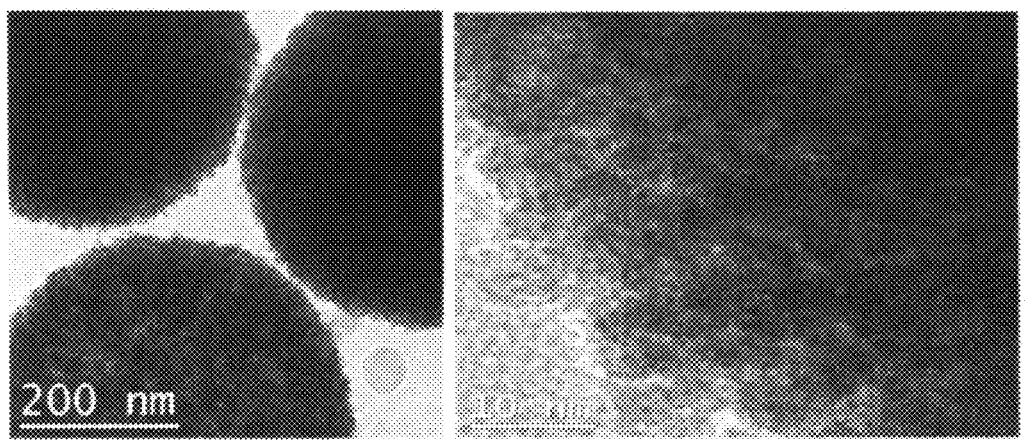
FIG. 6 is a TEM photograph showing a tail portion of the cuprous oxide particle produced according to the composition example.
Figure 7:
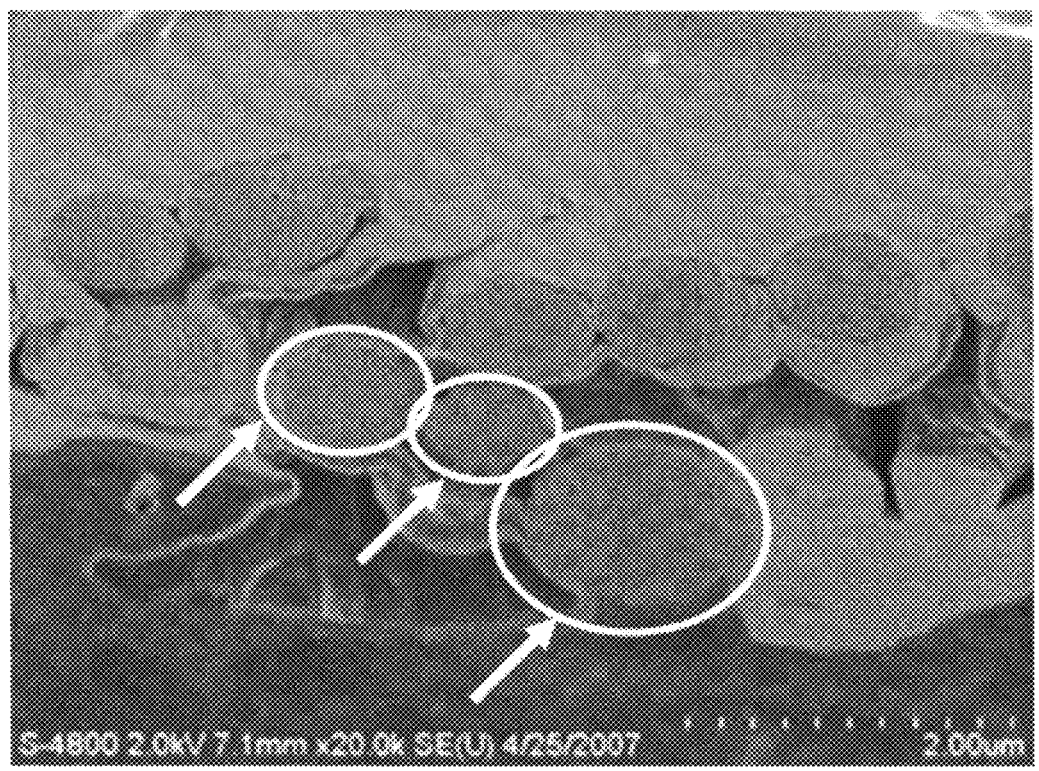
FIG. 7 is a SEM photograph showing a section of the cuprous oxide particle produced according to the composition example, which is cut by FIB.

The cuprous oxide particles are shown in the figures: namely a SEM photograph (see FIG. 2), a TEM photograph (see FIG. 3), an XRD analysis graph (see FIG. 4), a structure analysis photograph of cuprous oxide particles using HRTEM (see FIG. 5), a TEM photograph of a tail portion of cuprous oxide particles (see FIG. 6), and a SEM photograph of a section of cuprous oxide particles cut by FIB (see FIG. 7).

Figure 4:
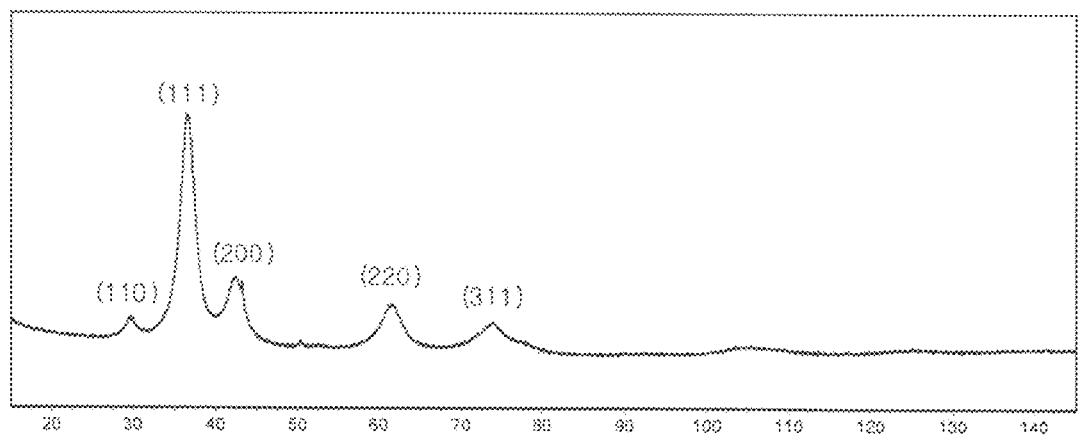
FIG. 4 is a XRD analysis graph of the cuprous oxide particle produced according to the composition example.

According to the Scherrer equation for the XRD pattern of FIG. 4, a crystal size was 4.4 nm, which is identical to a particle size of ~5 nm identified by TEM of FIG. 6.

The size of the formed assembly particles was measured for 200 or more particles using a graphic software (MAC-View) based on the SEM image (see FIG. 2), and the obtained statistical distribution was calculated such that an average size is 504.7 nm and a standard deviation is 91.8 (18%).

Forming Electroconductive Copper Patterning Layer

Example 1

The cuprous oxide assembly particles prepared according to the above method were dispersed in terpineol to make a dispersion solution in which the content of solid is 50 to 85 parts by weight. Subsequently, screen printing was conducted to print a wire with a thickness of 10 to 20 μm and a width of 2 mm on a polyethylene terephthalate substrate, and then laser was irradiated thereto under the conditions of 40 kHz, 60%/0.1 m/sec/0.2 mm mesh/6 mm offset to burn the wire. A specific resistance of the obtained copper wire was measured as 4.96E-4 Ωm.

Example 2

The example 2 is identical to the example 1, except that the laser irradiation conditions are changed into 40 kHz, 60%/0.1 m/sec/0.02 mm mesh/3 mm offset. A specific resistance of the obtained copper wire was measured as 3.96E-5 Ωm.

Figure 8:
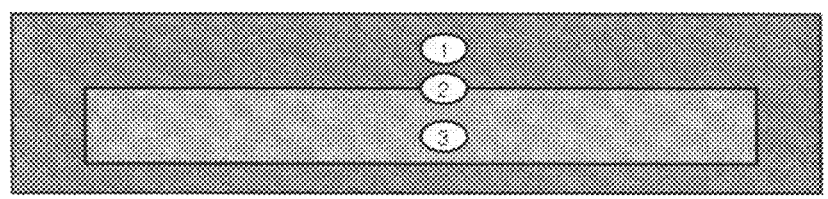
FIG. 8 is a schematic view showing a copper patterning layer, formed by patterning a cuprous oxide dispersed solution and then irradiating laser thereto partially.
Figure 9:
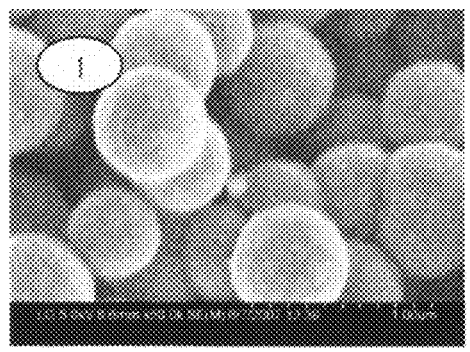
FIG. 9 is a SEM photograph showing a ① portion of FIG. 8.
Figure 10:
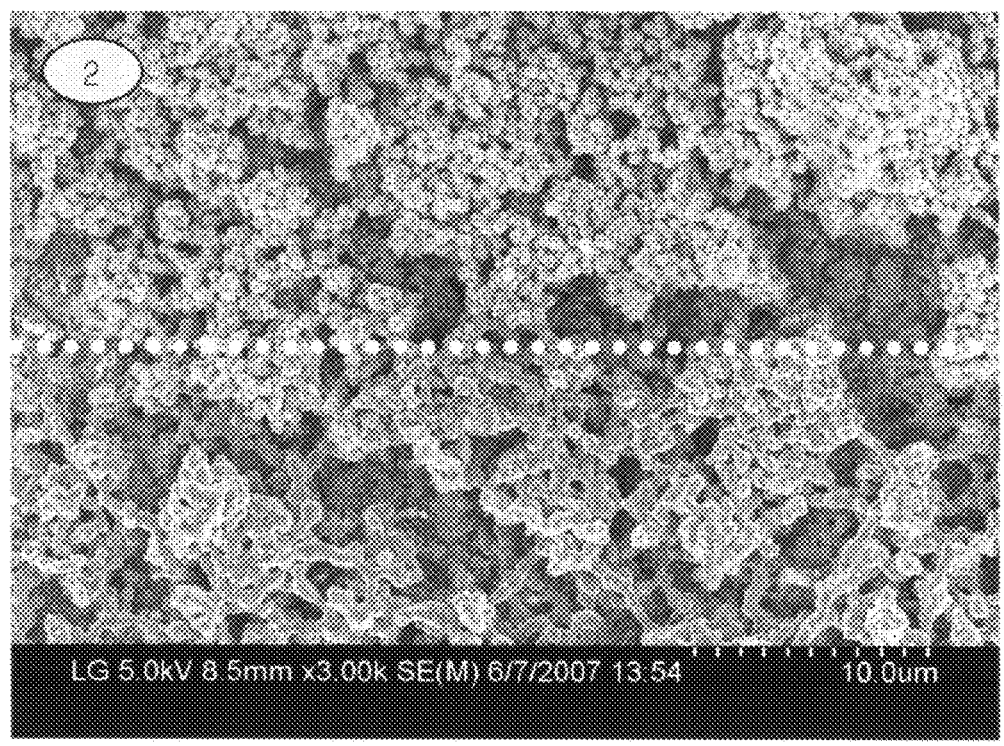
FIG. 10 is a SEM photograph showing a ② portion of FIG. 8.
Figure 11:
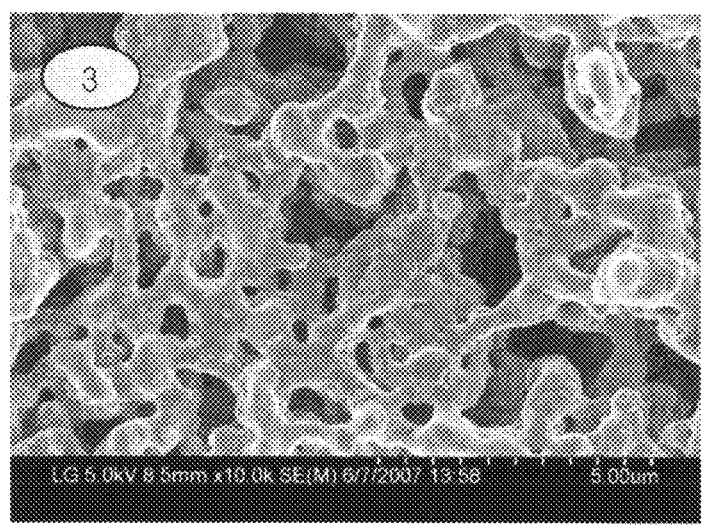
FIG. 11 is a SEM photograph showing a ③ portion of FIG. 8.

FIG. 8 is a schematic view showing a copper patterning layer, formed by patterning the cuprous oxide dispersed solution according to the example of the present invention and then irradiating laser thereto partially. In FIG. 8, ① is a portion not burned by laser, and this portion exhibits that the cuprous oxide particles keep their shape as they were, as illustrated in a SEM photograph of FIG. 9. ② of FIG. 8 is a border between a portion burned by laser and a portion not burned by laser, and the border between a portion burned by laser and a portion not burned by laser is clearly observed as illustrated in a SEM photograph of FIG. 10. ③ of FIG. 8 is a portion burned by laser, and cuprous oxide particles does not keep their shape but are connected with each other, so it would be understood that electric conductivity is improved.

Figure 12:
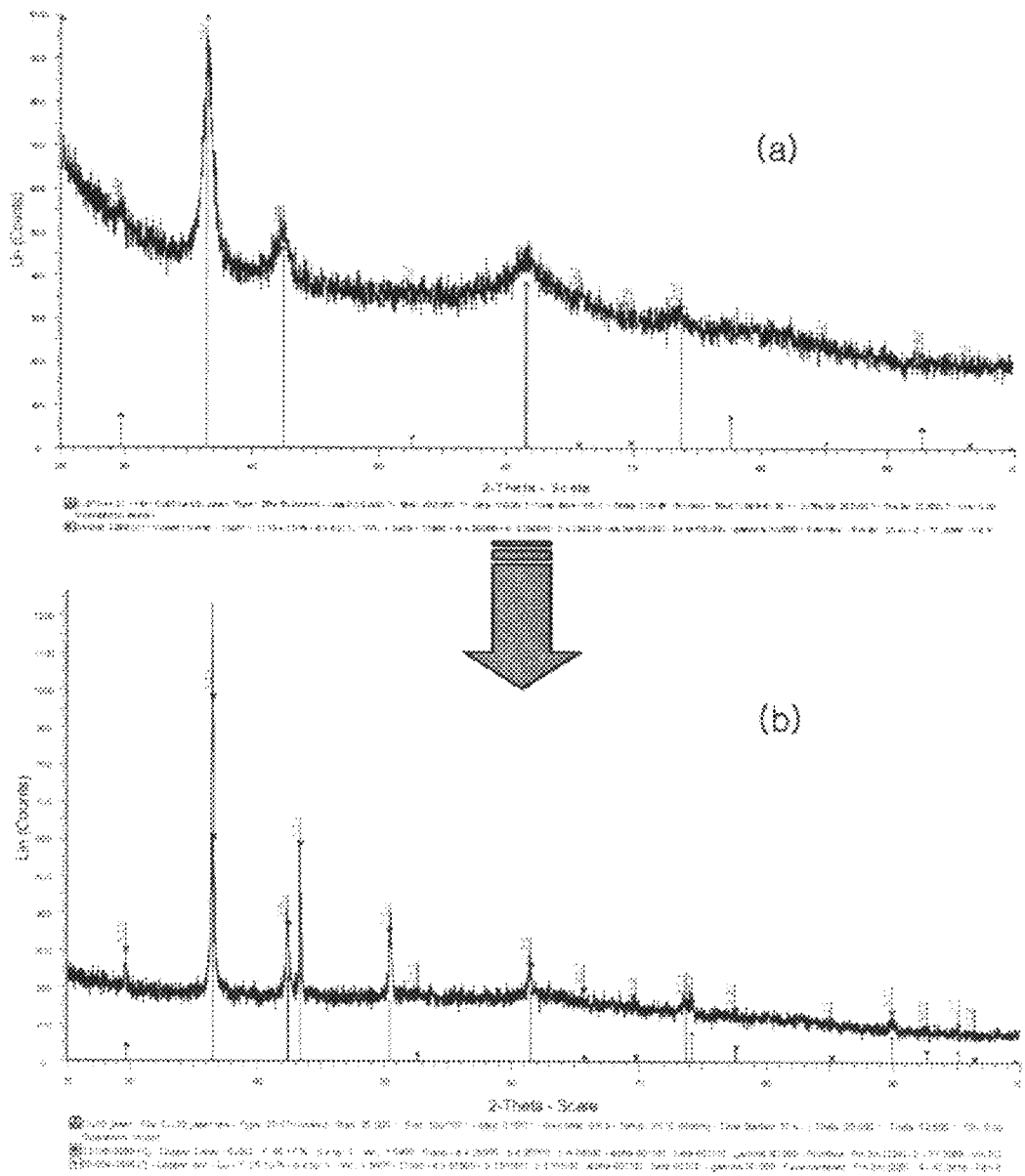
FIG. 12 (*a*) is a XRD graph showing a cuprous oxide particle used for forming a copper patterning layer according to an example.

Meanwhile, FIG. 12 (a) is a XRD graph showing a cuprous oxide particle used for forming a copper patterning layer according to the example, and it would be found that this cuprous oxide particle is identical to a cuprous oxide pattern with a cubic structure. In addition, FIG. 12 (*b*) is a XRD graph showing a sample obtained by scratching the ② portion of FIG. 8, which is a border between a portion burned by laser and a portion not burned by laser. It would be understood that peaks for copper (in red color) and peaks for cuprous oxide (in blue color) are mixed therein.

INDUSTRIAL APPLICABILITY

The preparation method of an electroconductive copper patterning layer according to the present invention burns a copper-based particle patterning layer with a strong energy within a short time by using laser. Thus, it is possible to obtain a copper patterning layer that is hardly oxidized even in the atmosphere, so a copper patterning layer with excellent electric conductivity is formed.

The invention claimed is:

1. A preparation method of an electroconductive copper patterning layer, comprising:
   (Step 1) preparing $Cu_2O$ precursor solution by dissolving a carboxyl copper compound expressed by the following Chemical FIG. 1, or a copper salt and a carboxyl group-contained compound expressed by the following Chemical FIG. 2 into a solvent:

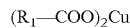    Chemical FIG. 1 where R1 is an alkyl group having a carbon number in the range from 1 to 18,

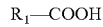    Chemical FIG. 2 where R1 is an alkyl group having a carbon number in the range from 1 to 18,
   adding a weak reducing agent having a standard reduction potential in the range from −0.2 to −0.05 V into the $Cu_2O$ precursor solution to form $Cu_2O$ spherical assembly particles, each of which is formed by agglomerating a plurality of $Cu_2O$ fine particles that have an average diameter in the range from 1 to 100 nm and a standard deviation on the diameter in the range from 0 to 10%, the $Cu_2O$ spherical assembly particles having an average diameter in the range from 0.1 to 10 μm and a standard deviation on the diameter in the range from 0 to 40%, and preparing a dispersion solution of the $Cu_2O$ spherical assembly particles;
   (Step 2) forming a patterning layer by printing or filling the dispersion solution of the $Cu_2O$ spherical assembly particles to a substrate into a predetermined shape; and
   (Step 3) irradiating laser to the patterning layer to burn and interconnect the copper-based particles contained in the $Cu_2O$ spherical assembly particles patterning layer.

2. The preparation method of an electroconductive copper patterning layer according to claim 1,
   wherein the $Cu_2O$ spherical assembly particles have a surface coated with a surfactant.

3. The preparation method of an electroconductive copper patterning layer according to claim 2,
   wherein the surfactant is at least one material or a mixture of at least two materials selected from the group consisting of polyacrylamide, polyvinylpyrrolidone, polyvinylalcohol, and a monomer having at least one functional group selected from the group consisting of —OH, —COOH, —SH and —NH.

4. The preparation method of an electroconductive copper patterning layer according to claim 3,
   wherein the surfactant is polyacrylamide.

5. The preparation method of an electroconductive copper patterning layer according to claim 1,
   wherein the dispersion solution of the $Cu_2O$ spherical assembly particles is a liquid dispersion solution obtained by dispersing the $Cu_2O$ spherical assembly particles into a dispersion solvent or a paste-type dispersion solution obtained by dispersing the $Cu_2O$ spherical assembly particles into a binder resin solution.

* * * * *